(12) United States Patent
Meyer, IV et al.

(10) Patent No.: US 8,011,361 B2
(45) Date of Patent: Sep. 6, 2011

(54) SOLAR POWER SYSTEM WITH TOWER TYPE HEAT DISSIPATING STRUCTURE

(75) Inventors: George Anthony Meyer, IV, San Jose, CA (US); Chien-Hung Sun, Zhongli (TW); Chieh-Ping Chen, Zhongli (TW)

(73) Assignee: Celsia Technologies Taiwan, Inc., Taoyuan (TW)

( * ) Notice: Subject to any disclaimer, the term of this patent is extended or adjusted under 35 U.S.C. 154(b) by 394 days.

(21) Appl. No.: 12/411,702

(22) Filed: Mar. 26, 2009

(65) Prior Publication Data

US 2010/0242952 A1    Sep. 30, 2010

(51) Int. Cl.
*F24J 2/10* (2006.01)

(52) U.S. Cl. ........ 126/689; 126/688; 126/690; 126/691; 126/698; 126/699; 126/700; 136/246; 136/259; 165/80.2; 165/80.3; 165/104.33

(58) Field of Classification Search .................. 126/688, 126/689, 690, 691; 136/246, 259; 165/104.33, 165/80.2, 80.3
See application file for complete search history.

(56) References Cited

U.S. PATENT DOCUMENTS

| | | | | |
|---|---|---|---|---|
| 2,532,303 | A * | 12/1950 | Hayward | 29/727 |
| 2,599,965 | A * | 6/1952 | Young | 165/134.1 |
| 3,130,084 | A * | 4/1964 | Loring | 136/206 |
| 3,406,753 | A * | 10/1968 | Habdas | 165/185 |
| 4,388,481 | A * | 6/1983 | Uroshevich | 136/246 |
| 4,960,468 | A * | 10/1990 | Sinton et al. | 136/259 |
| 5,101,632 | A * | 4/1992 | Aspden | 60/643 |
| 5,374,317 | A * | 12/1994 | Lamb et al. | 136/246 |
| 5,498,297 | A * | 3/1996 | O'Neill et al. | 136/246 |
| 5,574,626 | A * | 11/1996 | Smith | 361/204 |
| 5,651,414 | A * | 7/1997 | Suzuki et al. | 165/104.14 |
| 5,793,611 | A * | 8/1998 | Nakazato et al. | 361/704 |
| 5,991,151 | A * | 11/1999 | Capriz | 361/704 |
| 6,009,938 | A * | 1/2000 | Smith et al. | 165/185 |
| 6,102,110 | A * | 8/2000 | Julien et al. | 165/104.33 |
| 6,397,926 | B1 * | 6/2002 | Sato et al. | 165/80.3 |
| 6,735,864 | B2 * | 5/2004 | Sato et al. | 29/890.03 |
| 6,945,319 | B1 * | 9/2005 | Li et al. | 165/104.33 |
| 7,011,144 | B2 * | 3/2006 | Zeighami et al. | 165/104.21 |
| 7,081,584 | B2 * | 7/2006 | Mook | 136/246 |
| 7,173,179 | B2 * | 2/2007 | Nicoletti et al. | 136/246 |
| 7,249,626 | B2 * | 7/2007 | Hao et al. | 165/104.33 |
| 7,607,802 | B2 * | 10/2009 | Kang et al. | 362/294 |
| 7,619,888 | B2 * | 11/2009 | Yu et al. | 361/697 |
| 7,661,466 | B2 * | 2/2010 | Li et al. | 165/104.33 |
| 7,824,075 | B2 * | 11/2010 | Maxik | 362/294 |

(Continued)

*Primary Examiner* — Kenneth Rinehart
*Assistant Examiner* — Jorge Pereiro
(74) *Attorney, Agent, or Firm* — Chun-Ming Shih; HDLS IPR Services

(57) ABSTRACT

A tower type heat dissipating structure is applied to dissipate the heat of a solar power system. The solar power system is provided with a reflector having a hemispheric surface for reflecting the sunlight to a solar cell. The heat dissipating structure comprises a heat-conducting plate, a plate type heat pipe and a plurality of heat dissipating fins. One side of the heat-conducting plate is connected with the solar cell, and the other side is provided with a groove for being embedded an end of the plate type heat pipe. The heat dissipating fins is arranged with an inclination angle against the plate type heat pipe that can promote the heated air within the gaps to rise. The heat is rapidly conduced to prevent the solar cell from being destroyed by overheating for reducing the repairing costs.

8 Claims, 5 Drawing Sheets

U.S. PATENT DOCUMENTS

| | | | |
|---|---|---|---|
| 2003/0094273 A1* | 5/2003 | Toth et al. | 165/183 |
| 2004/0011395 A1* | 1/2004 | Nicoletti et al. | 136/246 |
| 2004/0035554 A1* | 2/2004 | Sato et al. | 165/80.3 |
| 2004/0179340 A1* | 9/2004 | Lin | 361/704 |
| 2007/0029068 A1* | 2/2007 | Cheng et al. | 165/80.3 |
| 2007/0089777 A1* | 4/2007 | Johnson et al. | 136/246 |
| 2007/0215198 A1* | 9/2007 | Jiang et al. | 136/246 |
| 2007/0267177 A1* | 11/2007 | Lin et al. | 165/104.21 |
| 2007/0285926 A1* | 12/2007 | Maxik | 362/294 |
| 2008/0055857 A1* | 3/2008 | Chen et al. | 361/703 |
| 2008/0115915 A1* | 5/2008 | Chen | 165/104.33 |
| 2008/0130230 A1* | 6/2008 | Yu et al. | 361/700 |
| 2009/0014154 A1* | 1/2009 | Schick et al. | 165/80.3 |
| 2009/0027889 A1* | 1/2009 | Kang et al. | 362/294 |
| 2009/0159126 A1* | 6/2009 | Chan | 136/259 |
| 2009/0279256 A1* | 11/2009 | Peng et al. | 361/697 |
| 2010/0132922 A1* | 6/2010 | Meyer et al. | 165/104.19 |

* cited by examiner

SOLAR POWER SYSTEM WITH TOWER TYPE HEAT DISSIPATING STRUCTURE

BACKGROUND OF THE INVENTION

1. Field of the Invention

The present invention generally relates to a solar power system, and more particularly to a solar power system having a heat dissipating structure.

2. Description of Prior Art

In recent years, solar energy is seriously emphasized because it is a natural resource without discharging carbon dioxide. The solar energy is functioned as an electric power generator by means of solar cells. However, the heat of the sunlight, which cannot be converted into electric energy, must be dissipated so that the solar cells can normally operate under a proper temperature.

A conventional solar power generation device usually comprises a seat, a transparent cover and a plurality of solar cells. The transparent cover is fixed on the lateral side of the seat, and the solar cells are arranged inside the seat. Thus, the solar cells receive the sunlight and convert it into electric energy. Furthermore, the bottom of the seat is provided with a plurality of parallel heat dissipating fins.

In above structure, the heat is usually accumulated on the bottom of the seat, so it may lead the solar cell to be destroyed. The poor heat dissipating efficiency will bring a high maintenance cost.

SUMMARY OF THE INVENTION

It is a primary object of the invention to provide a solar power system with a tower type heat dissipating structure, in which the tower type heat dissipating structure can rapidly conduct the heat to prevent solar cells from being destroyed by overheating.

Another object of the invention is to provide a solar power system with a tower type heat dissipating structure for the solar cells operating under a proper temperature without consuming electricity A further object of the invention is to provide a solar power system with a tower type heat dissipating structure, in which the heat can be rapidly conducted.

To achieve the foregoing objects, the present invention provides a solar power system with a tower type heat dissipating structure. The solar power system is provided with a reflector having a hemispheric surface for reflecting the sunlight to solar cells. The heat dissipating structure comprises a heat-conducting plate, at least one plate type heat pipe and a plurality of heat dissipating fins. One side of the heat-conducting plate is connected with the solar cell, and the other side is arranged with at least one groove for being embedded by an end of the plate type heat pipe. Furthermore, the heat dissipating fins incline against the plate type heat pipe. The heat dissipating fins have a plurality of slots for accommodating the plate type heat pipe.

In comparison with the conventional solar power system, the tower type heat dissipating structure of the present invention is connected with the solar cells, wherein the heat dissipating fins are slantly disposed on both sides of the plate type heat pipe that can promote the heated air within the gaps to rise. The heat can rapidly be conducted to prevent solar cells from being destroyed by overheating for reducing the maintenance costs. Furthermore, the heat dissipating structure comprises the plate type heat pipe having a large heat dissipation area and being capable of conducting heat rapidly. The heat of the solar cells can be dissipated by natural convection without consuming extra electricity, thus improving economical and practical utility.

DETAILED DESCRIPTION OF THE INVENTION

The technical characteristics, features and advantages of the present invention will become apparent in the following detailed description of preferred embodiments with reference to the accompanied drawings, and the preferred embodiments are used for illustrating the present invention only, but not intended to limit the scope of the present invention.

Figure 1:
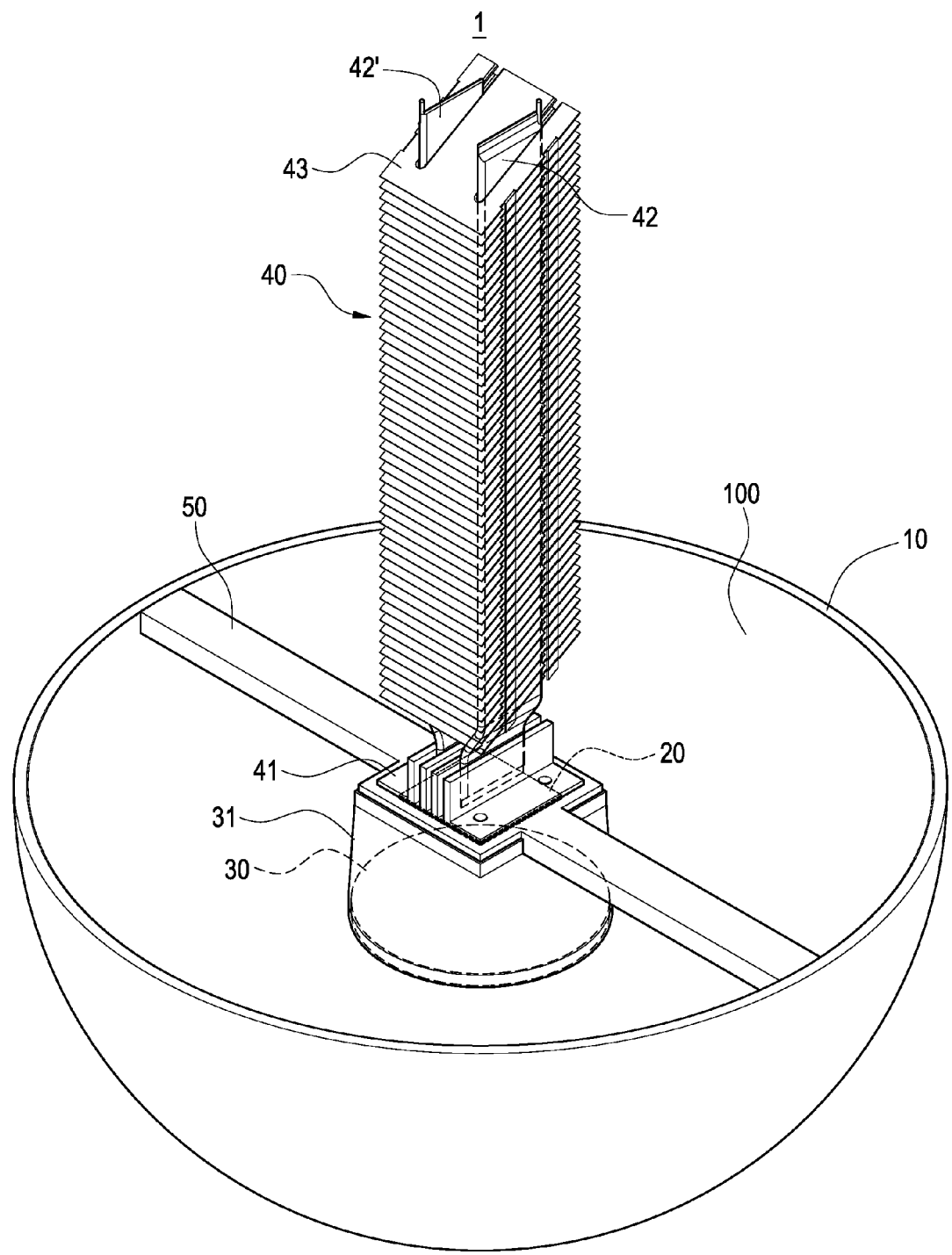
FIG. 1 is a perspective view of a solar power system provided with a tower type heat dissipating structure of the present invention.

Please refer to FIG. 1, the tower type heat dissipating structure of the present invention is applied in a solar power system 1. The solar power system 1 comprises a reflector 10, a solar cell 20, a converging lens 30 and a tower type heat dissipating structure 40. In the present invention, the reflector 10 is a hemispheric shell for reflecting the sunlight to the solar cell 20. The solar cell 20 is arranged in a direction facing the reflector 10, so that the solar cell 20 receives the reflected sunlight to perform the photoelectric conversion. The converging lens 30 is fixed between the reflector 10 and the solar cell 20 by a bracket 31. The converging lens 30 converges the sunlight to the solar cell 20.

The tower type heat dissipating structure 40 prevents the solar cell 20 from being destroyed by overheating. The tower type heat dissipation structure 40 comprises a heat-conducting plate 41, two plate type heat pipes 42, 42' and a plurality of heat dissipating fins 43. The heat dissipation structure 40 is installed over the reflector 10, wherein the heat-conducting plate 41 connects with the reflector 10 by a plate 50.

Figure 2:
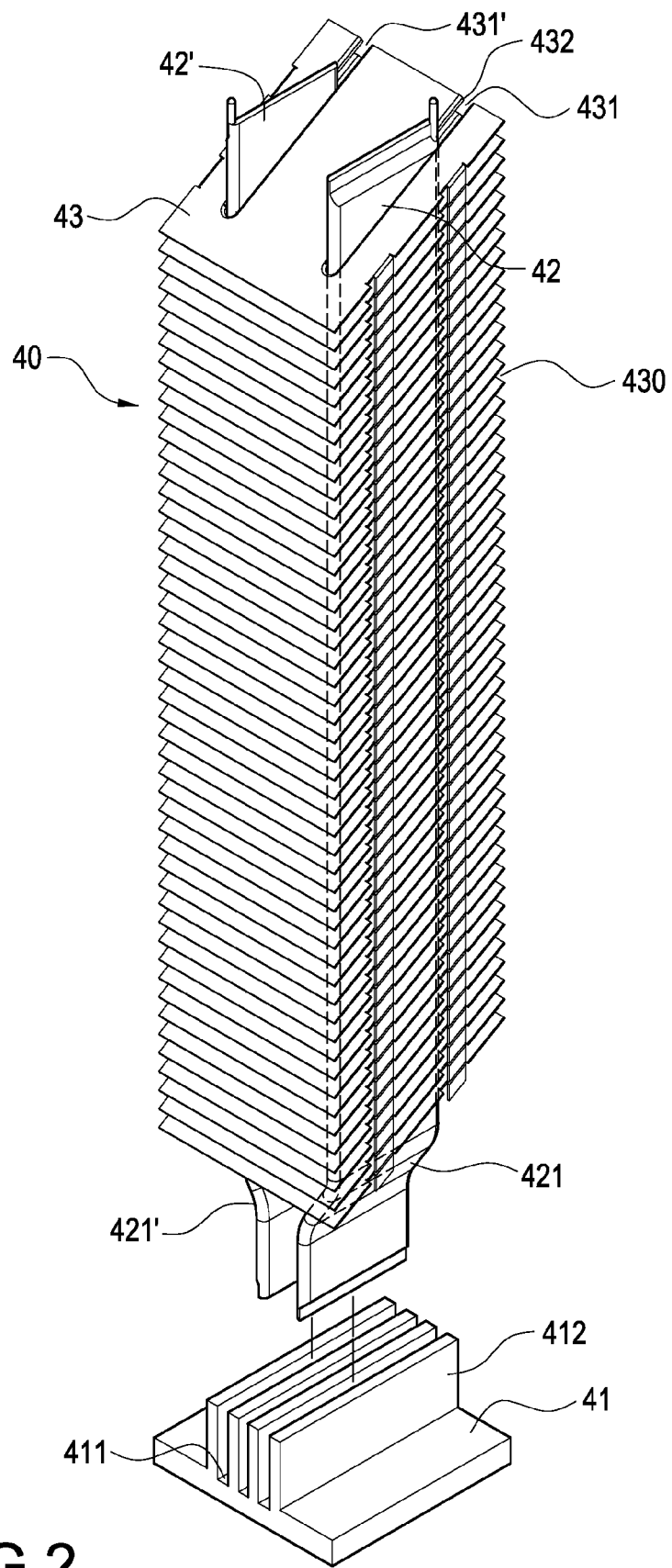
FIG. 2 is an assembled perspective view of the tower type heat dissipating structure of the present invention.
Figure 3:
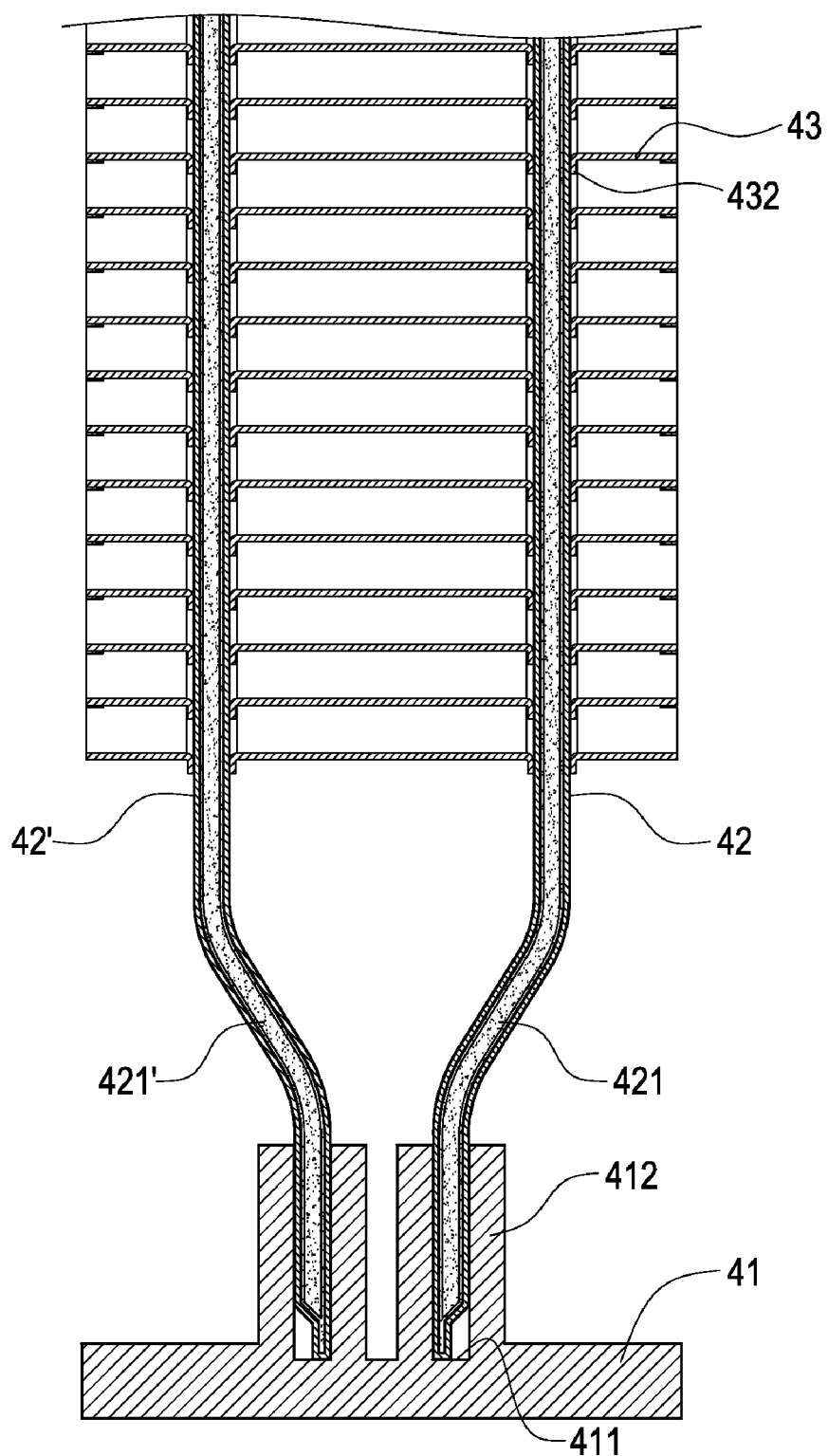
FIG. 3 is a sectional view showing part of the tower type heat dissipating structure of the present invention.

Further referring to FIGS. 2 and 3, the plate type heat pipes 42, 42' are prependerlly embedded in the heat-conducting plate 41. The heat dissipating fins 43 are stacked with an inclined angle against the plate type heat pipes 42, 42'.

The heat-conducting plate 41 is made of metal with great thermo-conductivity, such as copper or aluminum. One side of the heat-conducting plate 41 is connected with the solar cell 20, and the other side is provided with a plurality of grooves 411 for being embedded by one end of the plate type heat pipes 42, 42', wherein each groove 411 is formed by two side plates 412.

The plate type heat pipes 42, 42' are of a barlike shape. One end of each of the plate type heat pipes 42, 42' is embedded in one of the grooves 411. Each plate type heat pipe 42, 42' has a bent section 21, 21' on the side near the heat-conducting plate 10, which are sandwiched between the two side plates 412 for increasing the contacting area between the heat-conducting plate 41 and the plate type heat pipes 42, 42'. In the present invention, the bent directions of the bent sections 421, 421' are in directions of approaching to each other for shorting the distance between two plate type heat pipes 42, 42' in the side near the heat-conducting plate 41.

The heat dissipating fins 43 are stacked with a gap 430 between two adjacent fins. The heat dissipating fin 43 is provided with two slots 431 for accommodating the plate type heat pipes 42, 42'. A flange 432 on an edge of the slot 431 contacts the plate type heat pipes 42, 42' for increasing the contact area between the heat dissipating fin 43 and the plate type heat pipes 42, 42'. The heat dissipating fins 43 are arranged with an inclined angle against the plate type heat pipes 42, 42', in which the inclined angle is preferredly within a range from 25 degrees to 35 degrees. That is, the heat dissipating fins 43 are aslant disposed on the plate type heat pipes 42, 42' with an angle approximately from 25 degrees to 35 degrees. In the shown embodiment, the two slots 431, 431' are provided on the heat dissipating fin 43. In fact, the number of the slots 431 in the heat dissipating fin 43 and that of the plate type heat pipes 42, 42' can be changed correspondingly. For example, the number of the slot 431 and that of plate type heat pipe 42, 42' also can be one or three.

Figure 4:
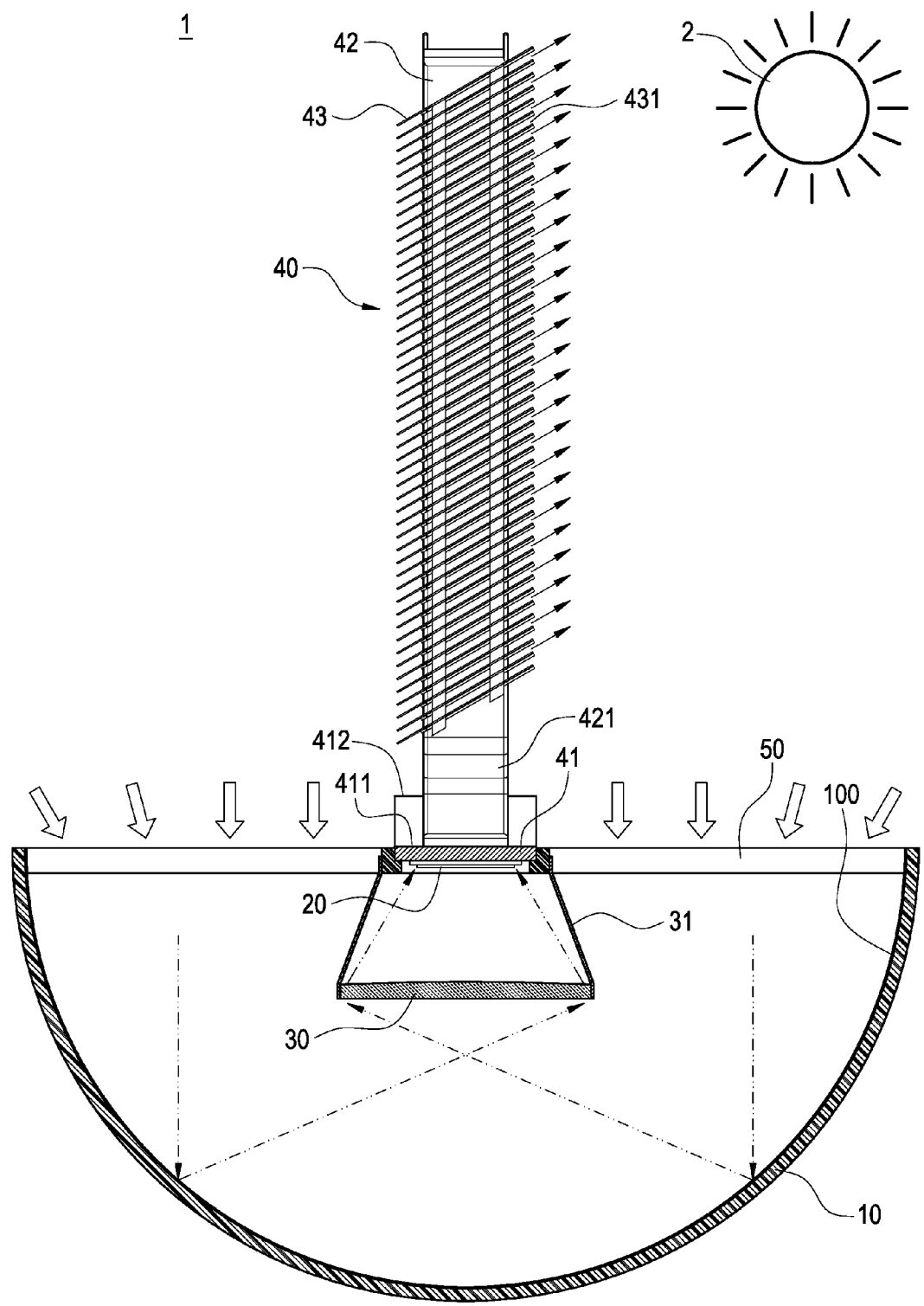
FIG. 4 is a schematic view showing the operating state of the solar power system provided with the tower type heat dissipating structure of the present invention.

Referring to the FIG. 4, when the reflector 10 having a hemispheric surface 100 is shined by the sunlight from the sun 2 and then reflects the sunlight to the converging lens 30. The sunlight will pass through the converging lens 30 and be convergently reflected to the solar cell 20. Thus the solar cell 20 performs the photoelectric conversion for power supplying, and the heat will be dissipated by the tower type heat dissipating structure 40.

The heat from the solar cell 20 is first conducted to the heat-conducting plate 41, and then the heat-conducting plate 41 transfers most of the heat to the plate type heat pipes 42, 42'. By the flange 432 of the heat dissipating fins 43 contacting the plate type heat pipes 42, 42', the heat will be conducted to the heat dissipating fins 43.

Figure 5:
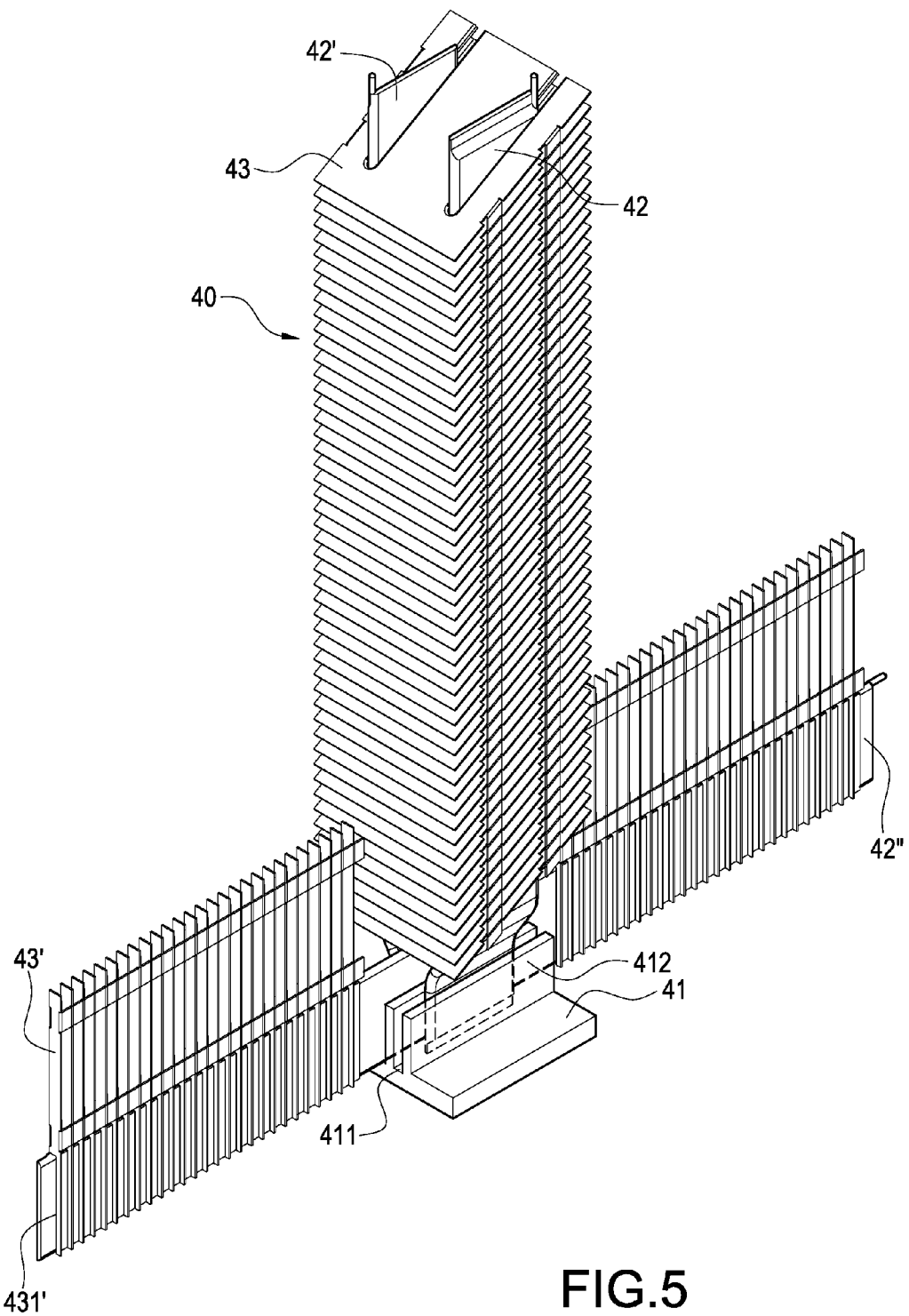
FIG. 5 shows a second embodiment of the tower type heat dissipating structure of the present invention.

FIG. 5 shows a second embodiment of the tower type heat dissipating structure of the present invention. An additional plate type heat pipe 42" is horizontally embedded in the groove 411 of the heat-conducting plate 41. The two side plates 412 attach both sides of the plate type heat pipe 42" separately. Plural heat dissipating fins 43" are arranged on the plate type heat pipe 42". Each of the heat dissipating fins 43" is provided with a slot 431" for accommodating the plate type heat pipe 42". By the plate type heat pipe 42" and plural heat dissipating fins 43" arranged thereon, the heat dissipating efficiency of the tower type heat dissipating structure can be improved.

While the invention is described in by way of examples and in terms of preferred embodiments, it is to be understood that the invention is not limited thereto. On the contrary, the aim is to cover all modifications, alternatives and equivalents falling within the spirit and scope of the invention as defined by the appended claims.

What is claimed is:

1. A solar power system with a tower type heat dissipating structure, comprising:
   a reflector for reflecting sunlight;
   a solar cell arranged in a direction facing the reflector for receiving reflected sunlight;
   a converging lens fixed between the reflector and the solar cell for converging the sunlight to the solar cell;
   a heat-conducting plate, whose one side is connected with the solar cell, and the other side has at least one groove on one side thereof;
   at least one plate type heat pipe, whose one end is perpendicularly embedded in the at least one groove; and
   a plurality of heat dissipating fins fixed on the at least one plate type heat pipe, each of the heat dissipating fins having a slot for accommodating the at least one plate type heat pipe, wherein the heat dissipating fins incline against the plate type heat pipe by an inclined angle.

2. The solar power system with a tower type heat dissipating structure of claim 1, wherein the heat-conducting plate connects with the reflector by a plate.

3. The solar power system with a tower type heat dissipating structure of claim 1, wherein the reflector is a hemispheric shell.

4. The solar power system with a tower type heat dissipating structure of claim 1, further comprising an another plate type heat pipe parallel to the at least one plate type heat pipe.

5. The solar power system with a tower type heat dissipating structure of claim 4, each of the two plate type heat pipes having a bent section on an end near the heat-conducting plate, wherein the bent directions of the bent sections are in directions of approaching to each other.

6. The solar power system with a tower type heat dissipating structure of claim 1, wherein the at least one groove is formed by two side plates.

7. The solar power system with a tower type heat dissipating structure of claim 1, wherein each of the heat dissipating fins has a flange on an edge of the slot for contacting the plate type heat pipe.

8. The solar power system with a tower type heat dissipating structure of claim 1, wherein the inclined angle is within a range from 25 degrees to 35 degrees.

* * * * *